United States Patent
Chen et al.

(10) Patent No.: US 7,423,347 B2
(45) Date of Patent: Sep. 9, 2008

(54) IN-SITU DEPOSITION FOR CU HILLOCK SUPPRESSION

(75) Inventors: Chung-Hsien Chen, Taipei (TW); Chun-Chieh Lin, Taichung (TW); Minghsing Tsai, Chu-Pei (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/334,849

(22) Filed: Jan. 19, 2006

(65) Prior Publication Data

US 2007/0164439 A1     Jul. 19, 2007

(51) Int. Cl.
  *H01L 23/48* (2006.01)
  *H01L 23/52* (2006.01)
  *H01L 29/40* (2006.01)

(52) U.S. Cl. .................. 257/762; 257/E23.161
(58) Field of Classification Search .......... 438/654, 438/792, 771, 659, 702; 420/542; 257/59, 257/781, 765, 762

See application file for complete search history.

(56) References Cited

U.S. PATENT DOCUMENTS

| | | | |
|---|---|---|---|
| 5,439,731 A | | 8/1995 | Li et al. |
| 5,691,571 A | * | 11/1997 | Hirose et al. ............ 257/751 |
| 6,067,680 A | * | 5/2000 | Pan et al. ................. 438/647 |
| 6,362,090 B1 | * | 3/2002 | Paik et al. ................ 438/614 |
| 6,426,289 B1 | * | 7/2002 | Farrar ...................... 438/670 |
| 6,445,422 B2 | | 9/2002 | Ngo et al. |
| 6,703,712 B2 | * | 3/2004 | Gilkes et al. ............. 257/762 |
| 6,713,875 B2 | * | 3/2004 | Farrar ...................... 257/767 |
| 6,724,089 B2 | * | 4/2004 | Trivedi et al. ............ 257/774 |
| 6,731,006 B1 | * | 5/2004 | Halliyal et al. .......... 275/758 |
| 6,756,302 B1 | * | 6/2004 | Shan et al. ............... 438/653 |
| 6,764,951 B1 | | 7/2004 | van Ngo |
| 6,818,548 B2 | | 11/2004 | Lavric et al. |
| 6,846,752 B2 | * | 1/2005 | Chambers et al. ........ 438/771 |
| 6,858,534 B2 | * | 2/2005 | Mouli ...................... 438/659 |
| 6,893,957 B2 | * | 5/2005 | Trivedi et al. ............ 438/632 |
| 6,897,147 B1 | | 5/2005 | Tsai et al. |
| 6,903,014 B2 | * | 6/2005 | Batra et al. .............. 438/687 |
| 6,979,625 B1 | * | 12/2005 | Woo et al. ................ 438/309 |
| 7,115,510 B2 | * | 10/2006 | Basol et al. .............. 438/687 |
| 7,169,700 B2 | * | 1/2007 | Chang et al. ............. 438/637 |
| 7,187,080 B2 | * | 3/2007 | Jiang et al. ............... 257/751 |
| 2004/0188850 A1 | * | 9/2004 | Lee et al. ................. 257/774 |
| 2004/0259378 A1 | * | 12/2004 | Chambers et al. ........ 438/771 |
| 2005/0275941 A1 | | 12/2005 | Liu et al. |
| 2006/0091551 A1 | * | 5/2006 | Lin et al. ................. 257/762 |

\* cited by examiner

*Primary Examiner*—David A Zarneke
(74) *Attorney, Agent, or Firm*—Slater & Matsil, L.L.P.

(57) ABSTRACT

A semiconductor interconnect structure having reduced hillock formation and a method for forming the same are provided. The semiconductor interconnect structure includes a conductor formed in a dielectric layer. The conductor includes at least three sub-layers, wherein the ratio of the impurity concentrations in neighboring sub-layers is preferably greater than about two.

14 Claims, 7 Drawing Sheets

IN-SITU DEPOSITION FOR CU HILLOCK SUPPRESSION

TECHNICAL FIELD

This invention relates generally to integrated circuits, and more particularly to the formation of interconnect structures in integrated circuits.

BACKGROUND

Copper has become the metal of choice over aluminum in the fabrication of integrated circuits because it has a lower resistance than aluminum and allows for the scaling down of devices. Despite its advantages, the use of copper in interconnection/interconnect structures poses several special problems that did not exist with the use of aluminum. One such problem is the formation of copper hillocks. Copper is a soft metal and has a much higher expansion coefficient than aluminum, so that it expands significantly when heated under typical temperatures used in semiconductor processing. Copper hillocks are a result of this expansion. Copper interconnect lines are typically formed by a dual damascene process wherein trench and via openings are etched into a dielectric layer and are then filled with copper. A barrier layer to prevent the migration of copper is typically formed in the trench and via openings before they are filled with copper. Copper within the trench and via openings is constrained on three sides by the barrier layer, and when heated, it can only expand upwards or along the copper line. Copper expands from the copper line in the form of spike-like projections, hence the name "hillocks." The formation of copper hillocks is a serious problem because hillocks cause shorts and voids, and can cause early breakdown of the semiconductor devices.

FIG. 1A illustrates a planarized copper dual damascene structure. The dual damascene structure has a first copper line 110 formed within a barrier layer 115, which is formed within a trench in a first dielectric layer 120. Copper hillocks such as 125 typically begin to form before any subsequent processing due to pent-up thermal expansion energy in the copper. FIG. 1B illustrates an interconnect structure 130 after a second dielectric layer 135 (typically SiN), which will serve as an etch stop layer, has been formed over the first copper line 110. A silicon nitride deposition is typically performed at about 400° C., a temperature at which copper will expand significantly and form copper hillocks. The copper hillocks 125 that already existed before the silicon nitride deposition will grow larger, and additional copper hillocks such as 145, will form during the deposition.

FIG. 1C illustrates the formation of a second interconnect structure 150, which includes a second copper line 165 in a third dielectric layer 155, over the second dielectric layer 135. The heat and pressure exerted on the first interconnect structure 130 during the formation of the third dielectric layer 155 and subsequent layers can cause the copper hillocks to grow even larger. The third dielectric layer 155 is typically carbon or fluorine doped silicon oxide that is deposited at temperatures of around 450° C. to 480° C. These temperatures will cause significant expansion of the copper and growth of hillocks. The growth of large copper hillocks can cause a short 160 between the first copper line 110 and the second copper line 165. Also, the formation of hillocks can cause a void 170 to form within the first copper line 110.

Multiple methods for solving the problem of copper hillocks have been explored. One explicit solution is to reduce the temperatures used in the processing. Copper hillocks typically form at temperatures above 150° C. Therefore, processing temperatures can be kept lower than this temperature to prevent hillocks from forming. However, this method is not effective in producing optimal semiconductor devices because low temperatures produce materials having inferior qualities such as lower density and less homogeneity.

Another solution to prevent the formation of copper hillocks is to anneal the copper before the step of chemical mechanical polish (CMP) of the copper. The intent of this anneal is to expend most of the thermal expansion energy of the copper into the formation of copper hillocks that can then be polished away during the CMP step. By expending most or all of the thermal expansion energy of the copper during this pre-CMP anneal, hillocks are less likely to form at a later point. Drawbacks of this solution are that extra process steps and thermal budget are required, and there is a risk of forming voids in the copper interconnect structures due to the hillock growth.

Yet another solution to reduce hillocks is to use two-step plating for the formation of copper layers. In a two-step plating process, a first copper layer is plated followed by an annealing. A second copper layer, which is virtually a repetition of the first copper layer, is then plated on the first copper layer. This method slightly improves the copper surface with smaller hillock sizes. However, the amount of hillocks may be increased, and thermal budget is also increased.

SUMMARY OF THE INVENTION

The preferred embodiments of the present invention provide a semiconductor interconnect structure having a reduced hillock formation and a method for forming the same.

In accordance with one aspect of the present invention, the semiconductor interconnect structure includes a conductor formed in a dielectric layer. The conductor includes at least three sub-layers each having a different impurity concentration, wherein the ratio of the impurity concentrations in neighboring sub-layers is greater than about two.

In accordance with another aspect of the present invention, the method for forming the preferred embodiments of the present invention includes providing a dielectric layer, forming a trench in the dielectric layer, depositing a barrier layer in the trench, forming a first sub-layer of a conductor over the barrier layer wherein a first control parameter is applied to achieve a first impurity concentration in the first sub-layer, forming a second sub-layer of the conductor on the first sub-layer wherein a second control parameter is applied to achieve a second impurity concentration in the second sub-layer, and forming a third sub-layer of the conductor on the second sub-layer wherein a third control parameter is applied to achieve a third impurity concentration in the third sub-layer. The impurity concentrations in neighboring sub-layers preferably have a ratio of greater than about two. The conductor preferably comprises copper.

By controlling impurity concentrations in sub-layers, less hillocks are formed, and hillock size is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
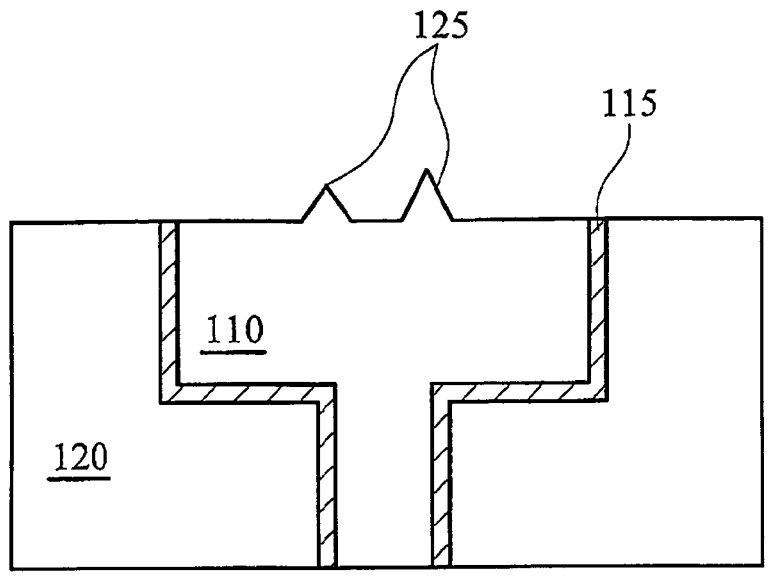
FIGS. 1A through 1C schematically illustrate the formation of hillocks in integrated circuits.
Figure 1B:
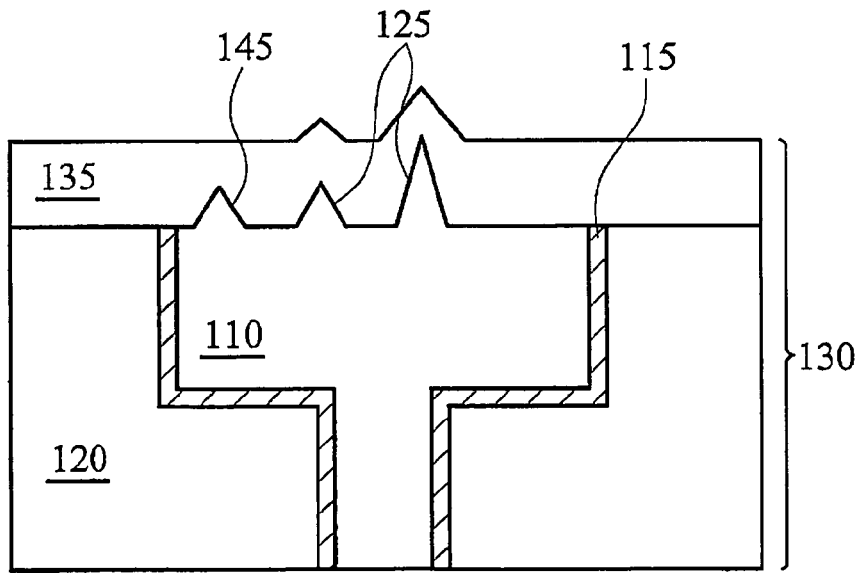
Figure 1C:
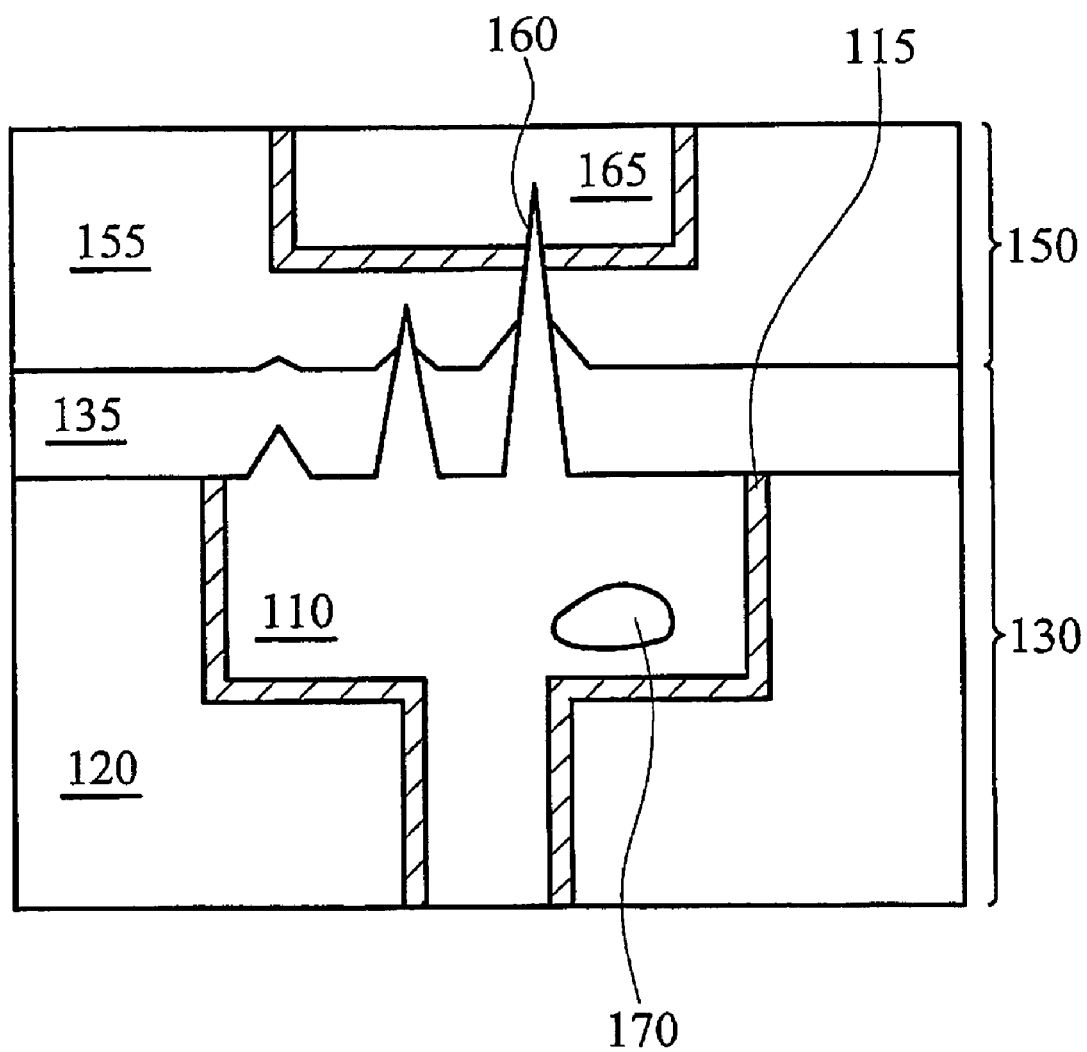
Figure 2:
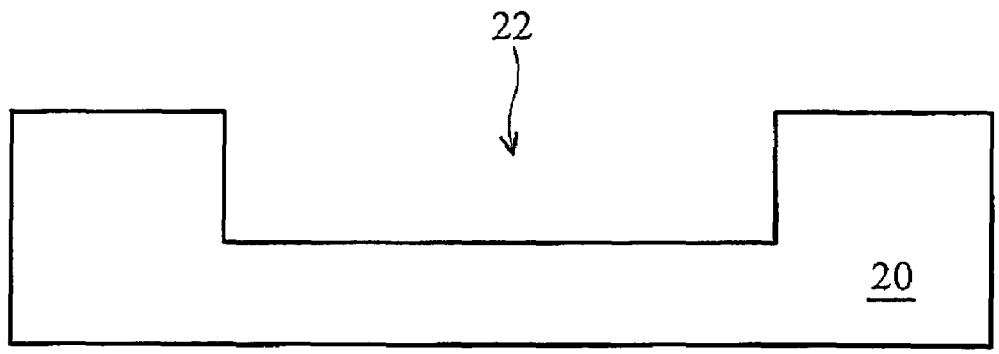
FIGS. 2 through 7B are cross-sectional views of intermediate stages in the manufacture of a preferred embodiment.

FIGS. 2 through 7B illustrate a preferred embodiment of the present invention, wherein a single damascene process is discussed. By slightly changing the formation process of openings, however, the solution provided by the preferred embodiment of the present invention can be applied to dual damascene processes. FIG. 2 illustrates the formation of an opening 22 in a dielectric layer 20. Dielectric layer 20 may be an inter-layer dielectric (ILD) layer or an inter-metal dielectric (IMD) layer. In the preferred embodiment, dielectric layer 20 has a low dielectric constant (k value), and is preferably formed by spin-on, chemical vapor deposition (CVD), plasma enhanced CVD (PECVD), atomic layer deposition (ALD), sub-atmospheric CVD (SACVD), low pressure CVD (LPCVD), or other known deposition techniques.

Opening 22 is preferably a trench opening, although it can be other openings for forming metal features, such as a via opening, a contact opening, and the like. Preferably, opening 22 is formed by etching.

Figure 3:
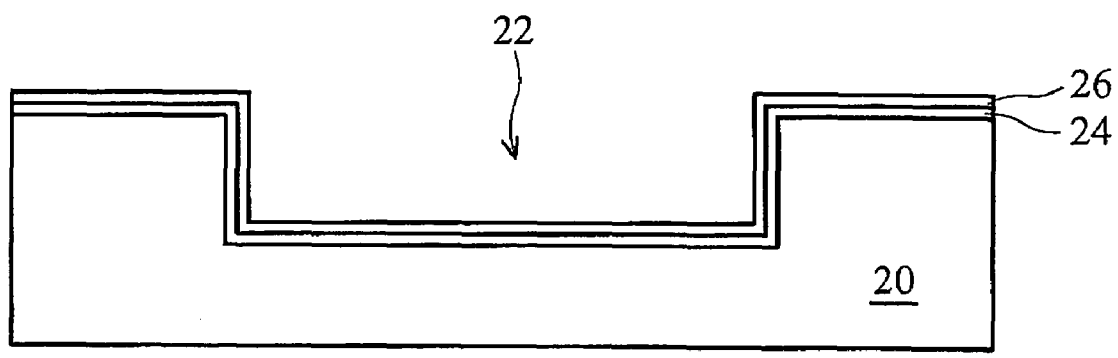

Referring to FIG. 3, a barrier layer 24 and a seed layer 26 are formed. As is known in the art, copper has high diffusibility. To prevent diffused copper from degrading the dielectric layer 20, a diffusion barrier layer 24, also sometimes referred to as a liner 24, is preferably formed in the opening 22. Barrier layer 24 preferably comprises commonly used materials such as titanium, titanium nitride, tantalum, tantalum nitride, and the like, and may have a composite structure including more than one layer.

In the preferred embodiment, a seed layer 26 is further formed on barrier layer 24. The seed layer 26 acts as a cathode for electroplating a thick copper layer that overfills the opening 22. The seed layer 26 is preferably formed using plasma vapor deposition (PVD), atomic layer deposition (ALD), and the like, and has a thickness of several hundred angstroms, and more preferably less than about 1000 Å. Seed layer 26 may be doped with metallic impurities such as tin, aluminum, and the like for retarding copper migration. In other embodiments, seed layer 26 is omitted.

A copper layer including a plurality of sub-layers is then formed in the opening 22. In the preferred embodiment as described hereinafter, each of the sub-layers of the copper layer is formed by using an electroplating method, such as electrochemical plating (ECP). In other embodiments, chemical vapor deposition (CVD), atomic layer deposition (ALD), electro-less plating, physical vapor deposition, reflow metal, and the like can be used.

As is known in the art, ECP is performed in a plating bath containing electrolytes, and the electrolytes may be inorganic and organic compounds at low concentrations. Inorganic compounds may include copper sulfate ($CuSO_4$), sulfuric acid ($H_2SO_4$), and trace amounts of chloride ($Cl^-$) ions. Inorganic compounds may further include silver sulfate ($Ag_2SO_4$), zinc sulfate ($ZnSO_4$), tin sulfate ($ZnSO_4$), nickel sulfate ($NiSO_4$), and cobalt sulfate ($CoSO_4$). Organic compounds may include accelerators, suppressors, and levelers. Since electrolytes comprise elements other than copper, impurities are typically introduced into the resulting copper layer. In an exemplary plating embodiment using organic electrolytes, the accelerators include sulfur, the suppressors include sulfur and chlorine, and the levelers include sulfur, carbon and oxygen. Organic electrolytes may also comprise N and P. The plating is performed at a temperature of about 15 to about 30° C.

Figure 4:
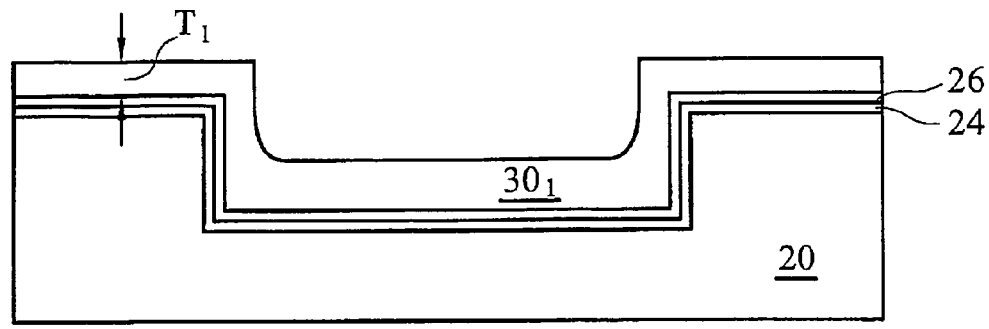

FIG. 4 illustrates the formation of a first copper sub-layer $30_1$ on the seed layer 26. Plating parameters are preferably controlled to achieve a first impurity concentration in copper sub-layer $30_1$. Exemplary plating parameters include a current density of between about 5 $mA/cm^2$ and about 10 $mA/cm^2$, and a (electrode) rotation speed of between about 50 revolutions per minute (RPM) and about 100 RPM. Preferably, the thickness $T_1$ of the copper sub-layer $30_1$ is greater than about 50 nm.

Figure 5:
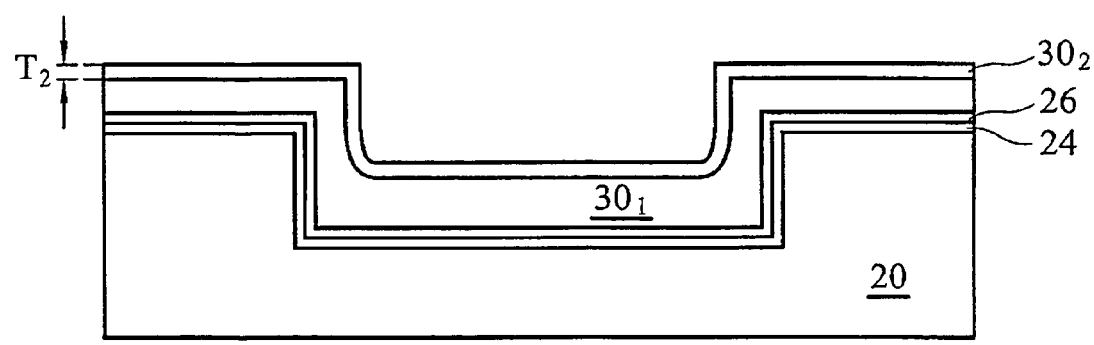

A second copper sub-layer $30_2$ is then formed on the first sub-layer $30_1$, as shown in FIG. 5. Preferably, sub-layer $30_2$ has a substantially different impurity concentration from the first sub-layer $30_1$. Exemplary plating parameters for controlling the impurity concentration include a current density of between about 30 $mA/cm^2$ and about 45 $mA/cm^2$, and a (electrode) rotation speed of between about 5 RPM and about 13 RPM. Preferably, the thickness $T_2$ of the copper sub-layer $30_2$ is greater than about 50 nm, and more preferably between about 50 nm and about 100 nm.

Figure 6:
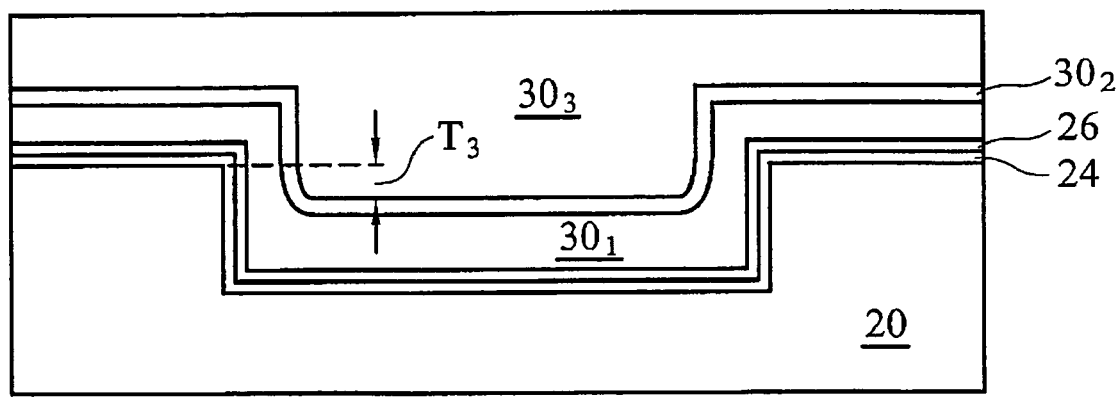

FIG. 6 illustrates the formation of a third copper sub-layer $30_3$ on the second copper sub-layer $30_2$. Similarly, the impurity concentration in sub-layer $30_3$ is preferably substantially different from the impurity concentration in the second sub-layer $30_2$. Exemplary plating parameters for controlling impurity concentration include a current density of between about 5 $mA/cm^2$ and about 10 $mA/cm^2$, and a rotation speed of between about 50 RPM and about 100 RPM. Preferably, the thickness $T_3$ of the portion of copper sub-layer $30_3$ below the surface of the dielectric layer 20 is greater than about 50 nm.

Figure 7A:
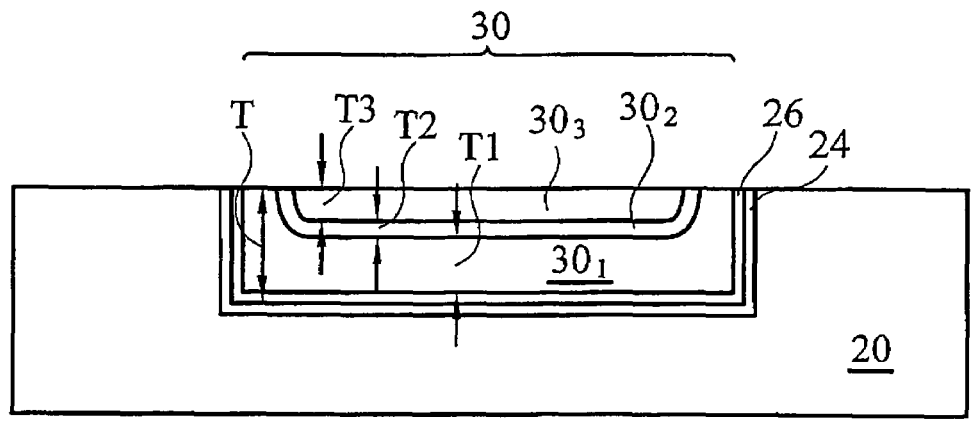
Figure 7B:
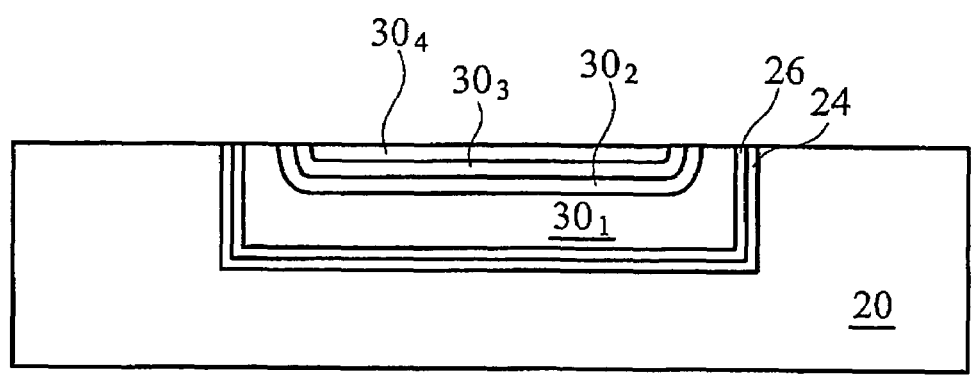

FIG. 7A illustrates a resulting structure after a chemical mechanical polish (CMP) to planarize the surface. Excessive copper above the top surface of dielectric layer 20 is removed, leaving a copper line 30 including three sub-layers $30_1$, $30_2$ and $30_3$. FIG. 7B illustrates another embodiment wherein one additional sub-layer $30_4$ is formed on the sub-layer $30_3$, although more sub-layers can be formed.

Preferably, impurities in sub-layers $30_1$, $30_2$ and $30_3$ include a metallic impurity such as silver, zinc, tin, nickel, cobalt, and the like, and/or a non-metallic impurity such as sulfur, chlorine, carbon, nitrogen, phosphorous, oxygen, and like, and combinations thereof. Sub-layers $30_1$, $30_2$ and $30_3$ may comprise the same or different impurities. Preferably, the impurity concentration ratio between sub-layer $30_2$ and its neighboring sub-layers $30_1$ and $30_3$ is greater than about two, and more preferably greater than about three, and even more preferably between about four and about five.

Figure 8:
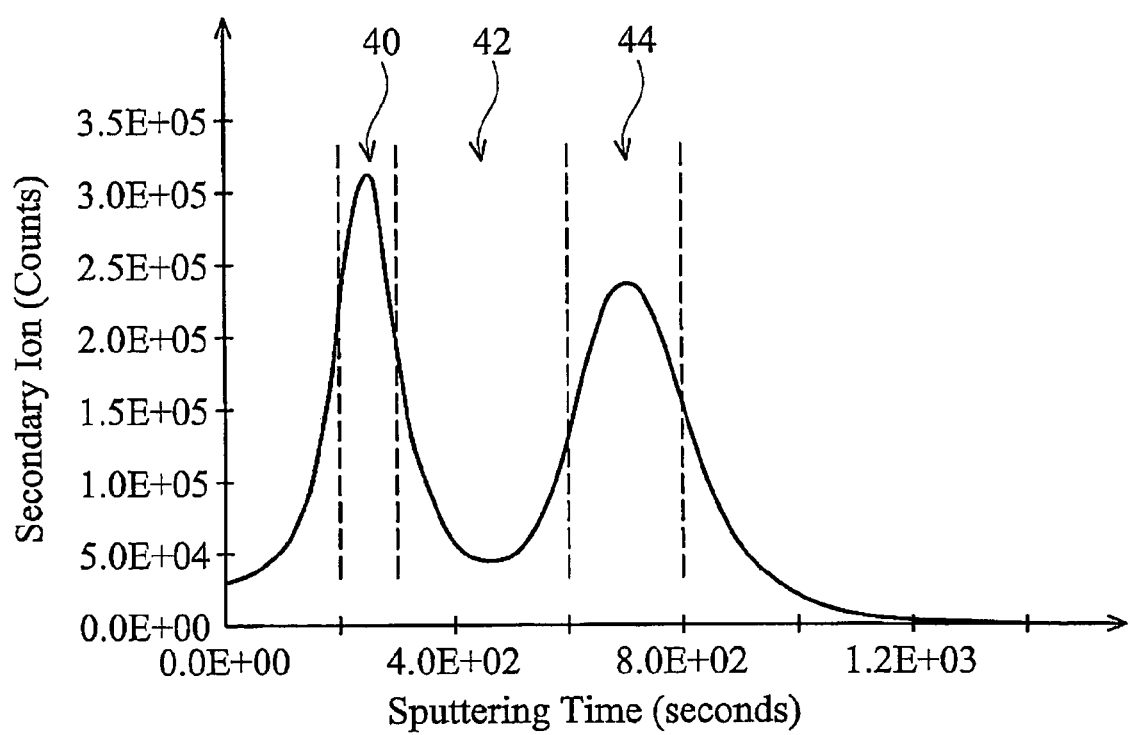
FIG. 8 illustrates an impurity concentration distribution as a function of depth into a sample copper line formed using the preferred embodiment.

In the preferred embodiment of the present invention, wherein sub-layers $30_1$, $30_2$ and $30_3$ are formed using plating parameters discussed in the previous paragraphs, the resulting impurity concentrations in copper line 30 have a high/low/high distribution from sub-layers $30_1$ through $30_3$. FIG. 8 illustrates an impurity concentration distribution in a sample copper line 30, which is measured using secondary ion mass spectrometry (SIMS). The X-axis shows the time used to sputter materials from the surface, and corresponds to the depth into the copper layer 30 from the top surface. The Y-axis shows secondary ion counts, which are proportional to the impurity concentration. Therefore, FIG. 8 reflects the impurity concentration as a function of the depth into the copper line 30 from the top surface. Three ranges of impurity concentrations have been observed. In regions 40 and 44, which correspond to sub-layers $30_1$ and $30_3$, the impurity concentrations are high, while in region 42, which corresponds to sub-layer $30_2$, the impurity concentration is low. Preferably, the ratio of the maximum impurity concentration in regions 40 and 44 to minimum impurity concentration in region 42 is significantly greater than two.

A comparison between prior art samples and samples formed using the preferred embodiments of the present invention reveals that both the number and size of hillocks on the surface of the preferred embodiments of the present invention are significantly reduced over prior art devices, which are formed as one layer copper features. A possible reason is that sub-layers $30_2$ and $30_3$ have substantially different impurity concentrations from the respective underlying layers, and the change of the impurity concentration disrupts the growth of copper grains, hence the growth of hillocks.

In a variation of the preferred embodiment, plating parameters are adjusted so that the sub-layer $30_2$ has a higher impurity concentration than sub-layers $30_1$ and $30_3$, thus forming a low/high/low impurity concentration distribution. Exemplary plating parameters for forming sub-layer $30_2$ include a current density of between about 5 mA/cm$^2$ and about 10 mA/cm$^2$, and a rotation speed of between about 50 RPM and about 100 RPM. Conversely, exemplary plating parameters for forming sub-layers $30_1$ and $30_3$ include a current density of between about 30 mA/cm$^2$ and about 45 mA/cm$^2$, and a rotation speed of between about 5 RPM and about 13 RPM. Preferably, in the resulting copper layer 30, the ratio of high impurity concentration to low impurity concentration is preferably greater than about two, and more preferably greater than three, and even more preferably between about four and five.

In further variations of the preferred embodiment, the impurity concentrations in sub-layers have a low/high/higher or a high/low/lower distribution, and the ratio of impurity concentrations in neighboring sub-layers is preferably greater than about 2, and more preferably greater than about three, and even more preferably between about four and five.

Copper line 30 may include more than three sub-layers (refer to FIG. 7B), and preferably, neighboring sub-layers have alternating impurity concentrations, so that the growth of the grains is effectively disrupted, and smaller, lesser hillocks are formed.

As discussed above, impurity concentrations can be changed by adjusting plating parameters, such as plating current density and rotation speed. Experiment results have revealed that it is difficult to increase the impurity concentration ratio in neighboring sub-layers to more than two simply by adjusting either plating current density or rotation speed. However, by adjusting both parameters at the same time, desirable impurity concentration difference can be achieved. This is also the reason why alternating impurity concentrations are preferred.

It is noted that the optimal plating parameters vary with respect to the type of impurities. For example, carbon concentration is higher if copper is plated at a rotation speed of 30 RPM rather than at 5 RPM or 50 RPM, while sulfur concentration is higher if copper is plated at a rotation speed of 50 RPM rather than at 5 RPM or 30 RPM. One skilled in the art will be able to select appropriate impurities and determine optimal plating parameters through routine experiments.

The concentration difference can also be achieved and probably increased by plating different sub-layers in different plating baths. Throughput, however, is reduced. Therefore, changing baths is more suitable for cases wherein higher difference of impurity concentrations is desired.

The thickness of each sub-layer affects the formation of hillocks. Preferably, the middle sub-layer $30_2$ has a thickness $T_2$ of greater than about 50 nm (refer to FIG. 7A). A thinner sub-layer $30_2$ may not be able to effectively disrupt the growth of copper grains, thus may be unable to reduce the formation of hillocks. If the total thickness T of the copper layer 30 is less than about 3 µm, the thickness $T_2$ of the sub-layer $30_2$ is preferably between about 50 nm and 0.1 µm (100 nm). With the increase of the total thickness T of the copper layer 30, the preferred thickness $T_2$ of the sub-layer $30_2$ is increased. For example, if the total thickness T of the copper layer 30 is about 5 µm, the thickness $T_2$ of the sub-layer $30_2$ is preferably about 0.1 µm.

The thickness $T_3$ of sub-layer $30_3$ is preferably between about 50 nm and about 0.1 µm when the total thickness of the copper layer 30 is less than about 3 µm. Sub-layer $30_3$ is preferably not too thick, as a too thick sub-layer $30_3$ is equivalent to a single thick copper layer as in the prior art. When the total thickness T of the copper layer 30 increases to about 5 µm, the thickness $T_3$ of the sub-layer $30_3$ preferably increases accordingly, and is more preferably less than about 1 µm.

It is appreciated that although the preferred embodiments use electro-chemical plating as an example to explain how a layered structure is formed, other deposition methods can also be used, providing controllable impurity concentrations can be achieved. Additionally, although copper is used in the metal line 30 as copper is the most common metal used for the formation of metal lines, the concept of the present invention is readily available for solving hillock problems on other conductive materials.

As in the preferred embodiments of the present invention, the formation of sub-layers only involves changing control parameters of plating. No extra masks, process steps, or cost are involved. In addition, throughput is not affected.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal interconnect structure comprising:
   a trench in a dielectric layer;
   a barrier layer on sidewalls of the trench; and
   a continuous conductor in the trench, wherein the conductor comprises:
   a first sub-layer having a first impurity concentration over the barrier layer;
   a second sub-layer having a second impurity concentration on the first sub-layer; and a third sub-layer having a third impurity concentration on the second sub-layer, wherein ratios of impurity concentrations in neighboring sub-layers are greater than about two, wherein the first, the second, and the third sub-layers have thicknesses of greater than about 50 nm.

2. The metal interconnect structure of claim 1, wherein impurities in the first sub-layer, the second sub-layer, and the third sub-layer comprise metallic materials.

3. The metal interconnect structure of claim 1, wherein impurities in the first sub-layer, the second sub-layer, and the third sub-layer comprise non-metallic materials.

4. The metal interconnect structure of claim 1, wherein impurities in the first sub-layer, the second sub-layer, and the third sub-layer comprise a material selected from the group consisting essentially of sulfur, chlorine, carbon, and combinations thereof.

5. The metal interconnect structure of claim 1, wherein the conductor comprises copper.

6. The metal interconnect structure of claim 1, wherein the dielectric layer comprises a low-k material.

7. The metal interconnect structure of claim 1, wherein the second impurity concentration is greater than the first and the third impurity concentrations.

8. The metal interconnect structure of claim 1, wherein the second impurity concentration is less than the first and the third impurity concentrations.

9. A metal interconnect structure comprising:
a trench in a dielectric layer:
a barrier layer on sidewalls of the trench; and
a conductor in the trench, the conductor comprising a seamless first material, wherein the conductor has an impurity concentration alternating between high impurity concentrations and low impurity concentrations, and wherein the high impurity concentrations and the low impurity concentrations have a ratio of greater than about two, and wherein each of the high impurity concentrations and low impurity concentrations extends a depth of greater than about 50 nm.

10. The metal interconnect structure of claim 9, wherein with an increase of a depth into the trench, the impurity concentration decreases from a first high impurity concentration to a low impurity concentration, and then increases to a second high impurity concentration.

11. The metal interconnect structure of claim 9, wherein with an increase of a depth into the trench, the impurity concentration increases from a first low impurity concentration to a high impurity concentration, and then decreases to a second low impurity concentration.

12. The metal interconnect structure of claim 9, wherein the conductor comprises a material selected from the group consisting essentially of sulfur, chlorine, carbon, and combinations thereof.

13. The metal interconnect structure of claim 9, wherein the conductor has three alternating impurity concentrations.

14. The metal interconnect structure of claim 9, wherein the conductor has more than three alternating impurity concentrations.

* * * * *